(12) United States Patent
Campbell et al.

(10) Patent No.: US 11,808,786 B2
(45) Date of Patent: Nov. 7, 2023

(54) PRECISION, HIGH BANDWIDTH, SWITCHING ATTENUATOR

(71) Applicant: TEKTRONIX, INC., Beaverton, OR (US)

(72) Inventors: Julie A. Campbell, Beaverton, OR (US); Daniel G. Knierim, Beaverton, OR (US); Barton T. Hickman, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 17/716,435

(22) Filed: Apr. 8, 2022

(65) Prior Publication Data

US 2022/0326278 A1 Oct. 13, 2022

Related U.S. Application Data

(60) Provisional application No. 63/196,381, filed on Jun. 3, 2021, provisional application No. 63/172,375, filed on Apr. 8, 2021.

(51) Int. Cl.
*G01R 1/04* (2006.01)
*G01R 27/28* (2006.01)

(52) U.S. Cl.
CPC ......... *G01R 1/0416* (2013.01); *G01R 1/0466* (2013.01); *G01R 27/28* (2013.01)

(58) Field of Classification Search
CPC ..... G01R 1/0416; G01R 1/0466; G01R 27/28
See application file for complete search history.

(56) References Cited

U.S. PATENT DOCUMENTS

| 6,784,679 | B2 * | 8/2004 | Sweet | G01R 1/06722 |
| | | | | 324/755.05 |
| 7,147,499 | B1 * | 12/2006 | Mayder | G01R 31/2889 |
| | | | | 439/260 |
| 8,076,989 | B2 * | 12/2011 | Peschke | G01R 1/24 |
| | | | | 333/4 |
| 2010/0141363 | A1 | 6/2010 | Yan et al. | |
| 2011/0148456 | A1 | 6/2011 | Mooyman-Beck et al. | |
| 2011/0148501 | A1 | 6/2011 | Granger-Jones et al. | |
| 2018/0145443 | A1 * | 5/2018 | Andreason | A61B 46/17 |
| 2019/0097845 | A1 * | 3/2019 | Francese | H03F 3/345 |
| 2020/0205915 | A1 * | 7/2020 | Kapadia | B25J 9/1689 |
| 2020/0300889 | A1 * | 9/2020 | Noguchi | G01R 29/08 |

FOREIGN PATENT DOCUMENTS

| KR | 10-1267526 | 5/2013 |
| KR | 10-1641019 | 7/2016 |

OTHER PUBLICATIONS

Korean Intellectual Property Office, International Search Report and Written Opinion for International Application PCT/US2022/024015, dated Jul. 28, 2022, 9 pages, Daejeon, Republic of Korea.

* cited by examiner

*Primary Examiner* — Akm Zakaria
(74) *Attorney, Agent, or Firm* — Miller Nash LLP; Andrew J. Harrington

(57) ABSTRACT

An apparatus has at least substrate having at least two conductive paths, a least two connectors positioned in a first plane, and a movable stage connected to one of the at least one substrate to move the one substrate perpendicular to the first plane form an electrically conductive path between two of the at least two connectors.

23 Claims, 13 Drawing Sheets

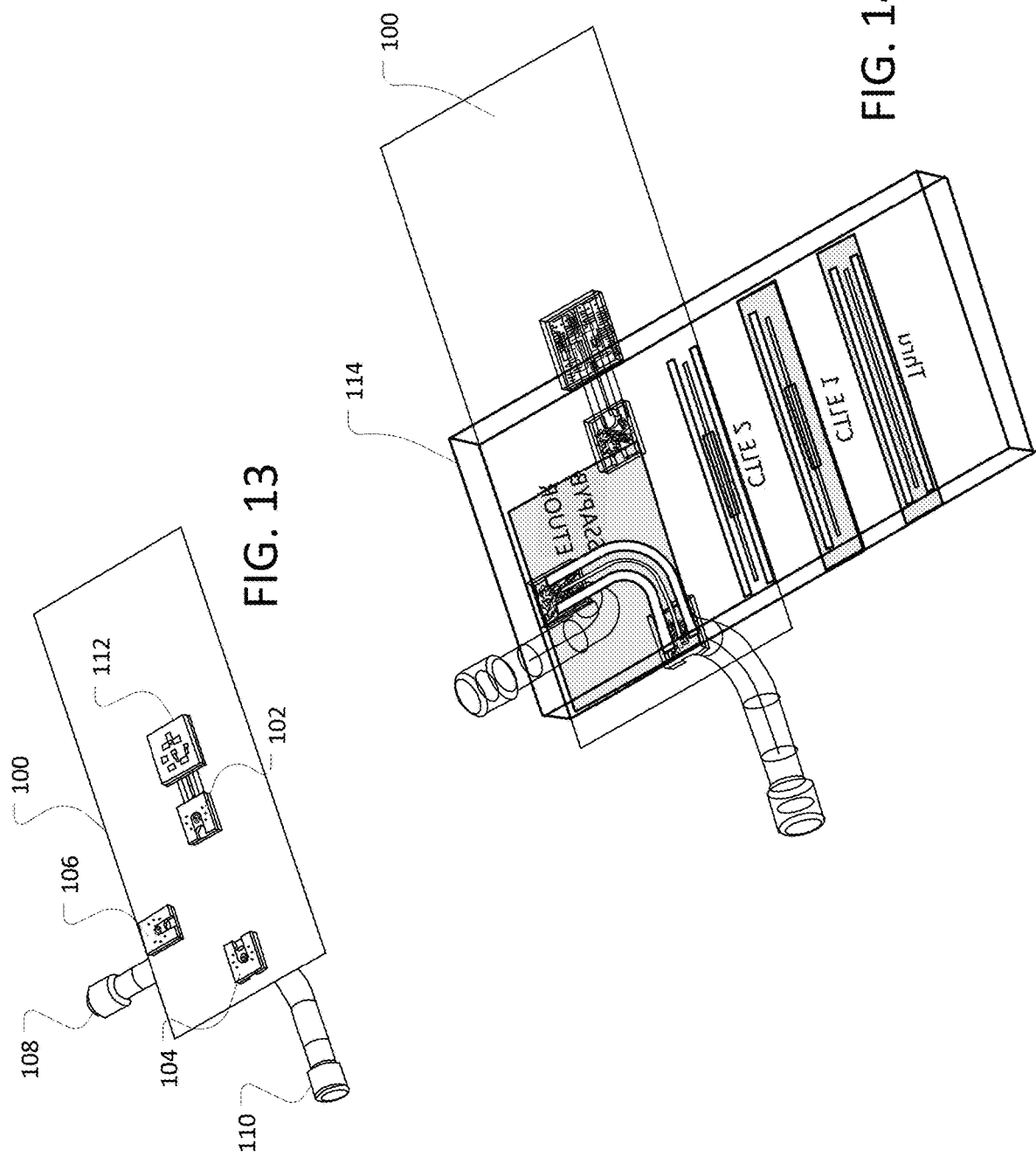

PRECISION, HIGH BANDWIDTH, SWITCHING ATTENUATOR

RELATED APPLICATIONS

This disclosure claims benefit of U.S. Provisional Patent Application No. 63/172,375, titled "PRECISION, HIGH BANDWIDTH, SWITCHING ATTENUATOR," filed Apr. 8, 2021, and U.S. Provisional Patent Application No. 63/196,381, titled, "PRECISION, HIGH BANDWIDTH, SWITCHING ATTENUATOR," filed Jun. 3, 2021 which is incorporated herein in its entirety.

TECHNICAL FIELD

This disclosure relates to test and measurement systems, more particularly to a switching attenuator for a test and measurement instrument or system.

BACKGROUND

Test and measurement instruments, such as oscilloscopes, are used in a wide variety of applications including, for example, testing of a device under test (DUT) according to optical Ethernet, wireless, and other high-speed standards. These applications often require switching of the dynamic range in these precision, high-bandwidth instruments. In conventional instruments, a user must manually install external coaxial terminators and/or attenuators to change the dynamic range between various operations of the test procedure. However, such manual user intervention is inefficient, prone to error, and makes automation of these testing procedures very complicated.

Furthermore, using such external terminators or attenuators may introduce errors, such as noise or timing distortions, into the signals measured from the DUT. While in some cases it may be possible to calibrate and correct for such errors, applying any such corrections is also a manual process in conventional test systems.

Embodiments of the disclosed technology address these and other shortcomings of conventional test systems.

BRIEF DESCRIPTION OF THE DRAWINGS

FIG. 13 shows an embodiment of a fixed plate component of a router.

FIG. 14 shows an embodiment of a router with a fixed substrate and a movable substrate.

DETAILED DESCRIPTION

One aspect of the disclosure includes a small geometry switching mechanism for an attenuator that provides best-in-industry isolation, low insertion loss, and low reflections. Another aspect of the disclosure includes methods and systems to monitor the state of the switching mechanism and automatically adjust the response of the test system by applying a correction based on the specific position of the switching mechanism, for example to correct for parasitic effects caused by the specific position of the switching mechanism. Embodiments of the disclosure allow for automation of testing of a DUT according to various signaling standards. For example, embodiments of the disclosure allow a test system to test a DUT according to the Peripheral Component Interconnect Express Generation 7 (PCIE or PCIe Gen 7) or 256 GBd Ethernet standards using on-the-fly dynamic range switching to run long cycle time tests without interruption for a manual attenuator adjustment.

Figure 1:
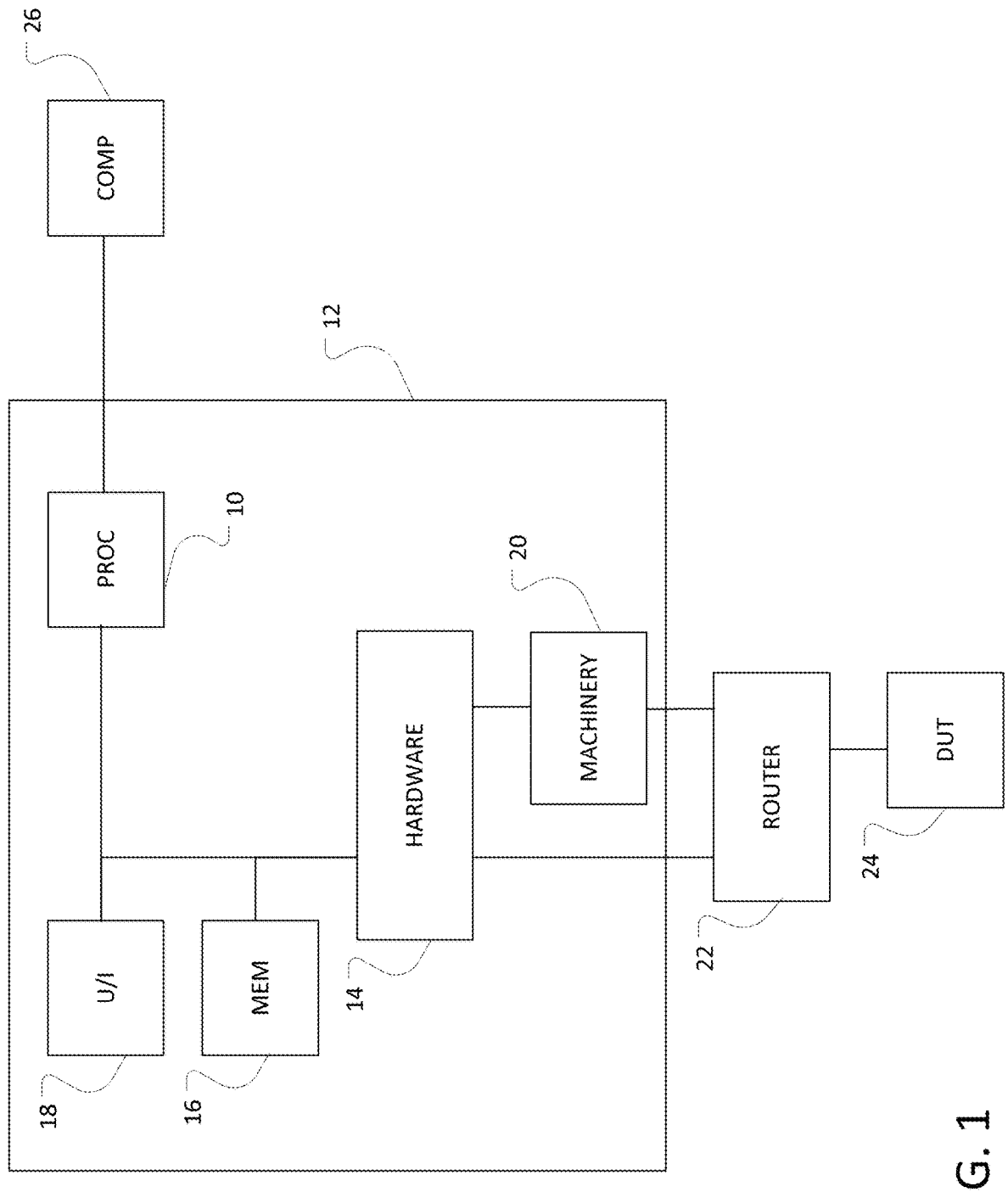
FIG. 1 shows an embodiment of a system including a routing switch apparatus.

The embodiments here move a switching substrate having at least two different conductive paths between at least two connectors. The paths connect two of the connectors to pass signals between them. One of the paths may comprise a path referred to here as a "through path" that connects signals coming into one of the connectors to another connector that will then transmit the signal. Typically, the connection will be between a device under test (DUT), and a test and measurement device such as an oscilloscope. FIG. 1 shows an embodiment of a system employing a switching apparatus such as those in the apparatus.

The test and measurement system of FIG. 1 includes a test and measurement device 12, and a switch 22. The test and measurement device 12 may connect to another computing device, or may be self-contained. The device 12 may have multiple components, only some of which are described here. The device may have a user interface 18 that may comprise a display, which may also be a touch screen, various controls and knobs, lights, etc., that allows a user to input the test parameters and may include the ability to operate the switch 22. The test and measurement device 12 may also include a memory such as 16, to store data received from the device under test, settings, test profiles, etc. The hardware 14 may include many different hardware components, such as analog-to-digital converters, analyzers, etc. The test and measurement system may also connect to an external computing device 26 the may perform some or all of the analysis on the received data.

In these embodiments, the hardware 14 may also include motors and controllers that will move the platter or platters of the switch to alter the routing paths, discussed in more detail later. Alternatively, the motors and controllers machinery 20 may be external to the hardware modules 14, and may be external to the test and measurement device 12. There machinery may include movable stages to move the substrate or substrates, and each stage may have a motor. For example, in one embodiment, there may be two stages, each with their own motor.

The router 22 connects between the device under test (DUT) 24 and the test and measurement device. Although FIG. 1 illustrates the routing switch, referred to here as a router, 22 being external to the test and measurement device 12, in some embodiments, the router 22 may be within the same housing as the test and measurement device 12. Generally, the router apparatus 22 allows routing of high frequency signals in a more automated manner, and may employ an S-parameter correction system in the machinery. The correction system monitors the position of the motors, controllers, or other positioning mechanisms to adjust automatically the response to correct for the specific configuration. Currently, users must manually install external coaxial terminators making automated testing very complicated. Further, this approach did not include any type of position corrections.

As mentioned above, one conductive path may be a through path. Another path may comprise an "attenuated path." Typically, the term "attenuator" comprises an arrangement of resistors that reduce the strength of a signal, i.e. attenuates the signal, such as a radio frequency (RF) or other signal. For purposes of this discussion, an "attenuated" path may include resistors and other circuit elements to form such structures as low pass or band pass filters, continuous time linear equalization (CTLE) filters, RF limiters, electrostatic discharge (ESD) protection networks. Another aspect of this switching apparatus includes the ability to switch in circuits that otherwise would add parasitics to the signal path, such as a time domain reflectometry (TDR) function circuits, discussed in more detail later.

Figure 2:
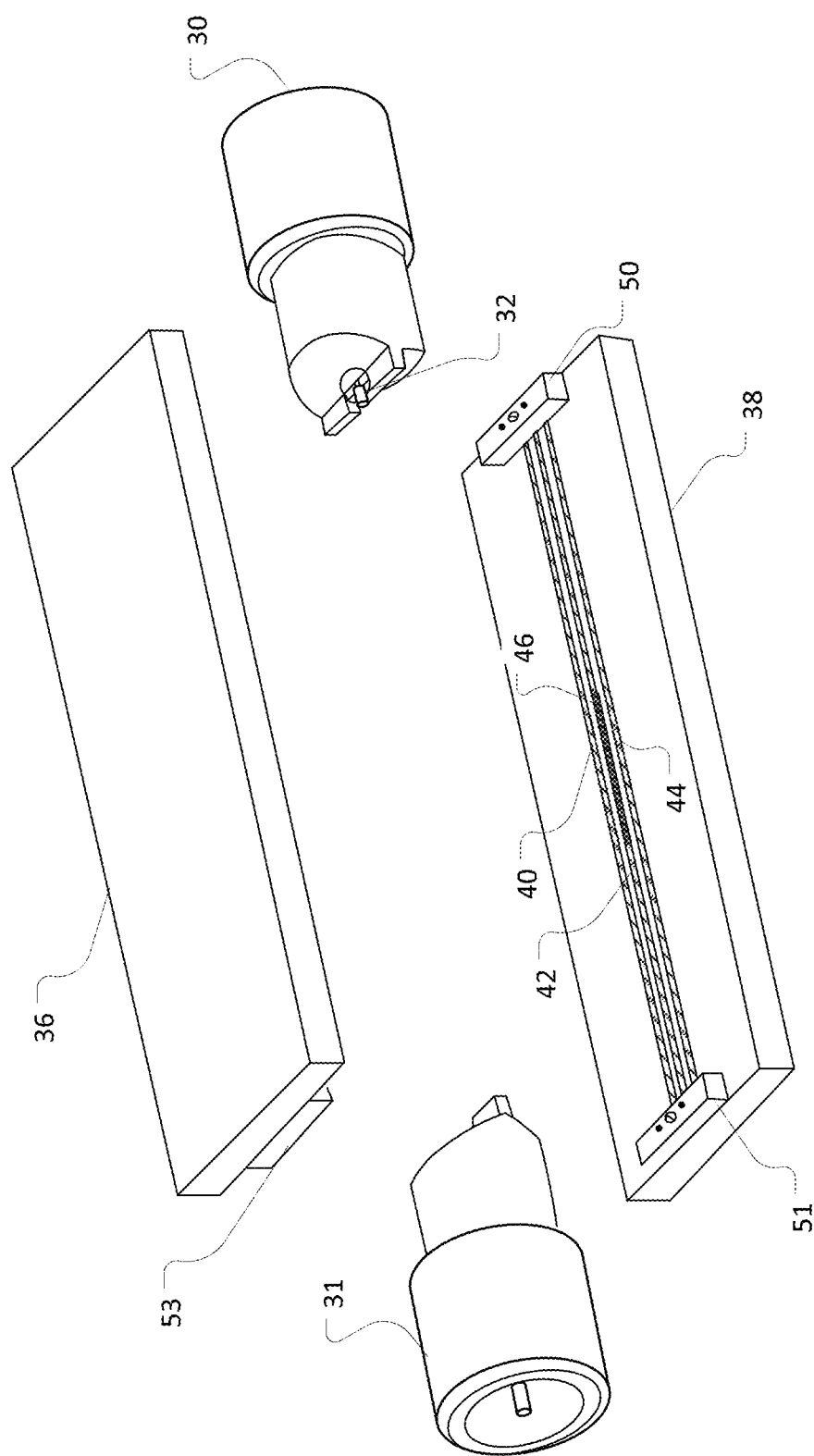
FIG. 2 shows an embodiment of a router apparatus.

FIG. 2 shows an embodiment of a router having an automated routing capability. The router has connectors 30 and 32. The connectors will include a coaxial end to allow the user to connect standard coaxial cables. The other end of the connectors have contacts 32 shown for connector 30, which may be spring contacts that connect to the center conductor of the coaxial end of the connector. Connector 31 has a center conductor not visible in this view. These contacts allow the substrates, 36 and 38, to move into position to contact the connectors. In FIG. 2, a first substrate 36 has a first conductive path, not shown in this figure, between its contact plate such as 53 and the other contact plate at the other end of substrate 36, not visible in this view. A second substrate 38 has another conductive path between the contact plates 50 and 51. The conductive paths may comprise ground-signal-ground paths, shown in FIG. 2, ground 40, signal 42, and ground 44. This embodiment of a conductive path includes an attenuator 46 and forms an attenuator signal path.

Figure 3:
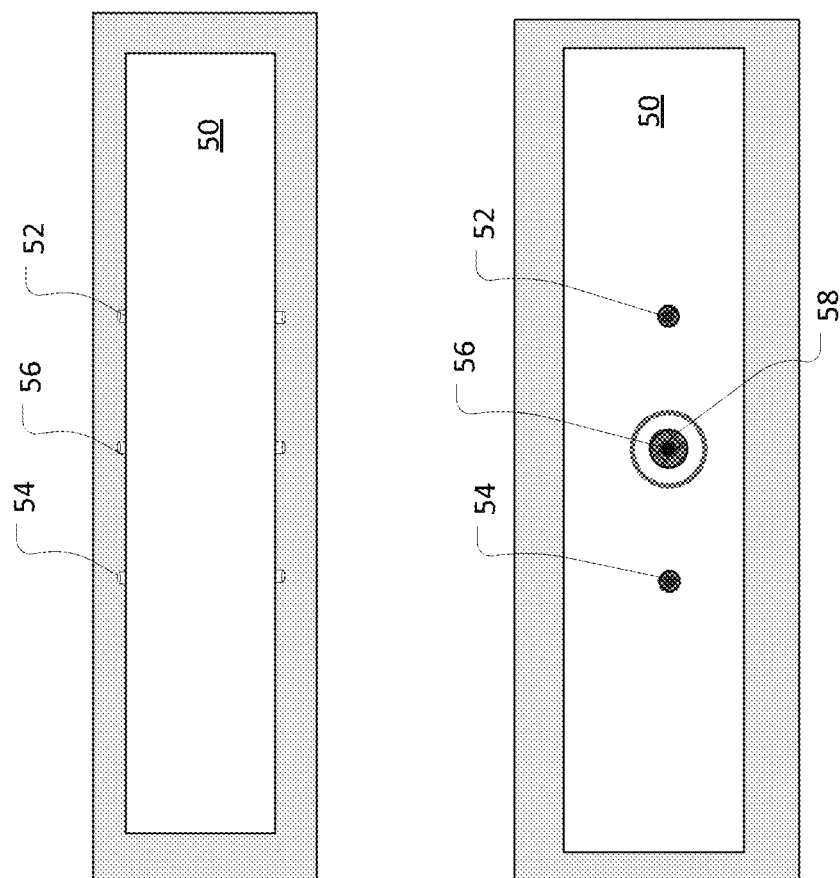
FIG. 3 shows two views of an embodiment of a contact plate.

The contacts such as 50 and 51 allow formation of a conductive path between the connectors, their respective spring contacts, the signal conductive path on the substrate, and the contact plates. FIG. 3 shows two views of an embodiment of the contactor plate 50. The top view is a side or end view of the contactor plate showing the protruding spring contacts 52, 54, and 56. The bottom view is a top view of the contactor plate, showing the two ground contacts 52 and 54 and the center contact 56 with the dielectric 58 surrounding it.

Figure 4:
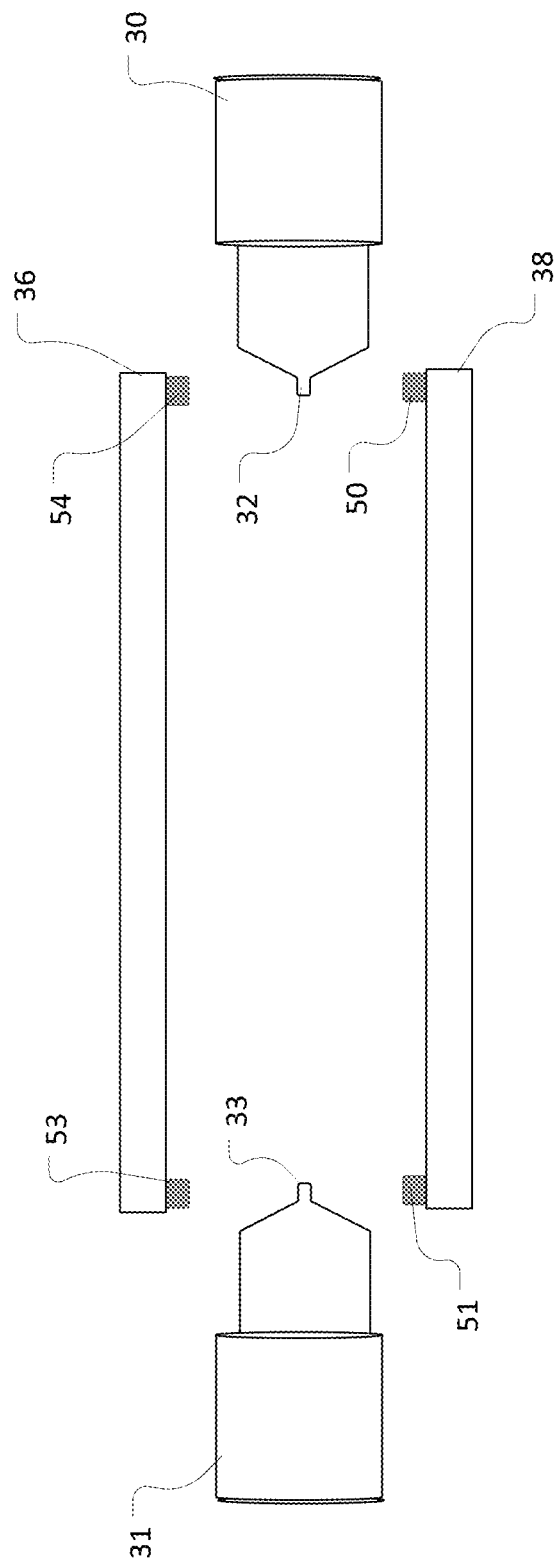
FIGS. 4-6 show side views of an embodiment of a router apparatus in different positions.
Figure 5:
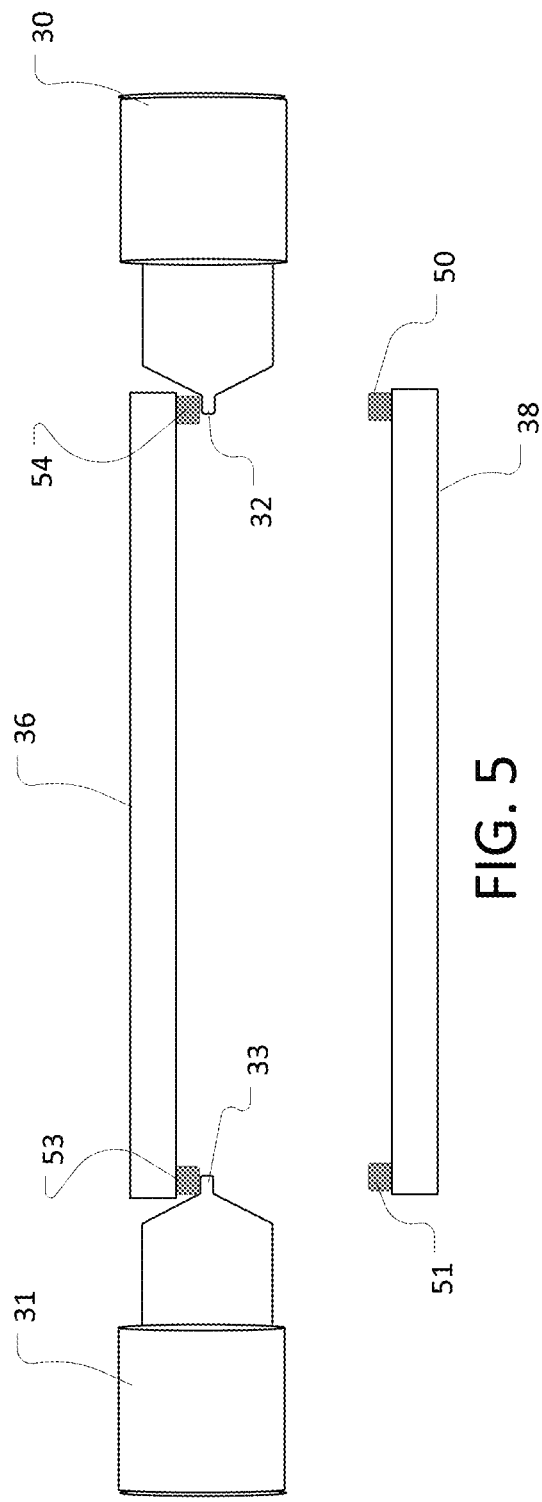
Figure 6:
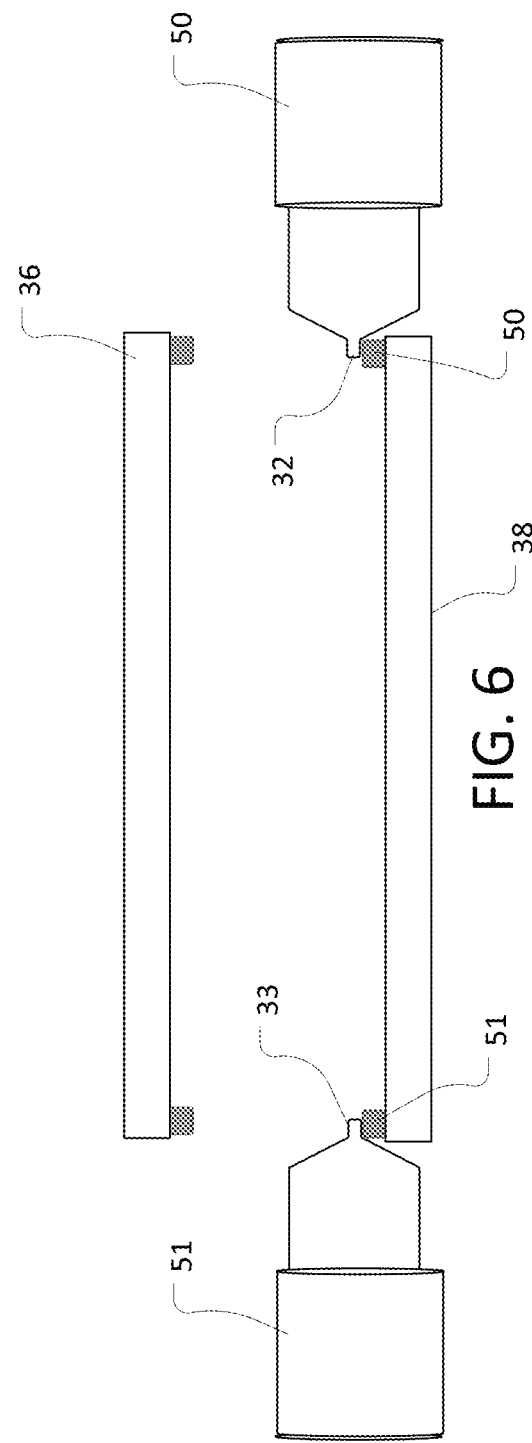

With these structures or structures to similar to them in place, FIGS. 4-6 show views of the substrates in the switch as they move between different positions. In this embodiment, both of the platters 36 and 38 have the capability to move. The two substrates 36 and 38 may be tied together to move up or down as a unit, and a movable stage or other moving part may provide the ability for them to move.

FIG. 4 shows a side view of the connectors 30 and 31 arranged adjacent to the ends of each of the substrates 38 and 36. The connectors are positioned so that the center conductors 32 and 33 and the ground contacts on the connectors can match the corresponding structures on the contactor plates 50 and 51 for substrate 38, and 53 and 54 for substrate 36, shown in FIG. 4. The contactor plates reside on both substrates. The position of FIG. 4 is the OPEN position, where no connection exists between the connectors 30 and 31.

FIG. 5 shows the switch in the upper path configuration. The substrate 36 moves, either independently or as a unit with substrate 38 to contact the connectors 30 and 31. As the connection occurs between the contacts 32 and 33 on the connectors and the contactor plates 53 and 54, a conductive path forms between the two connectors. In FIG. 6, the lower substrate 38 moves and forms a conductive path between the connectors using the contact plates 50 and 51, and the conductive path on substrate 38. The connectors enable these connections due to their unique structure. The two substrates may have conducting paths with different characteristics, such as one having and attenuator and one being a through path, or each having different attenuators, etc.

Figure 7:
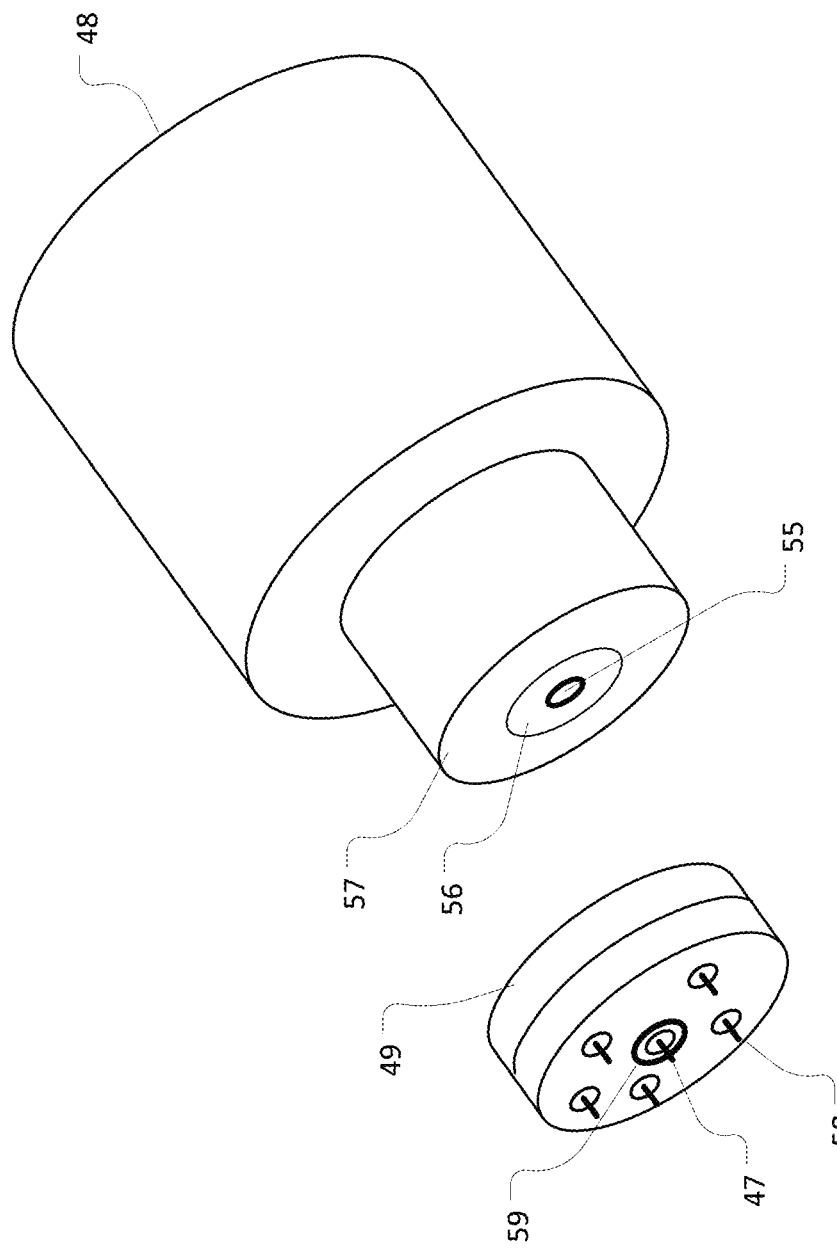
FIG. 7 shows an embodiment of a coaxial connector.

FIG. 7 shows an embodiment of a connector 48 having a different configuration than the connectors, such as 30, from FIGS. 4-6. The connector 48 has a face portion having a center conductor 55, surrounded by a dielectric 56 and a ground 57. The second portion 49 is an interface assembly having the center conductor 47, dielectric 59, and an array of ground contacts such as 58. This interface portion 49 has the same structures on the other side not visible on this view.

Figure 8:
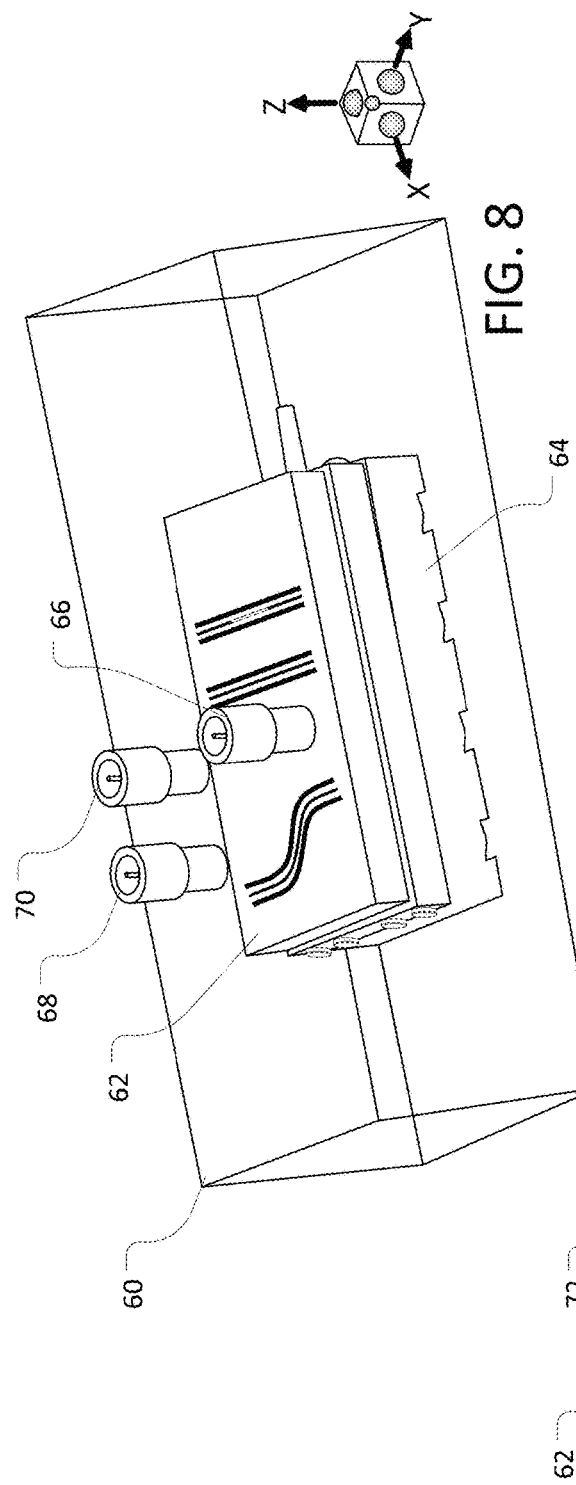
FIG. 8 shows an embodiment of a router including a movable stage.

FIG. 8 shows an embodiment of a switch apparatus only having one moving substrate. A housing 60, shown here as transparent, contains the substrate 62 with various conductive paths and a linear or translation stage 64. The stage moves the platter between various positions in a first plane, shown on the axis as the x-y plane. The stage will typically only move in one of the two planar directions, in this case the x-direction of the x-y plane. The stage will also cause the platter to move in the z-direction (up and down), perpendicular to the x-y plane. The contact plates are not show in FIG. 8 to allow better view of the routing substrate.

To form a connection between the connectors, the stage will move the substrate 62 up the z-axis relative to this drawing to contact the ends of the connectors nearest the substrate. The stage will also move the platter down the z-axis, along the x-axis (sideways), and back up the z-axis to form different paths between connectors. In one embodiment, connectors 68 and 70 may correspond to the input components of the test and measurement device. Connector 66 may correspond to the input connector of the scope, typically from a DUT fixture.

Figure 9:
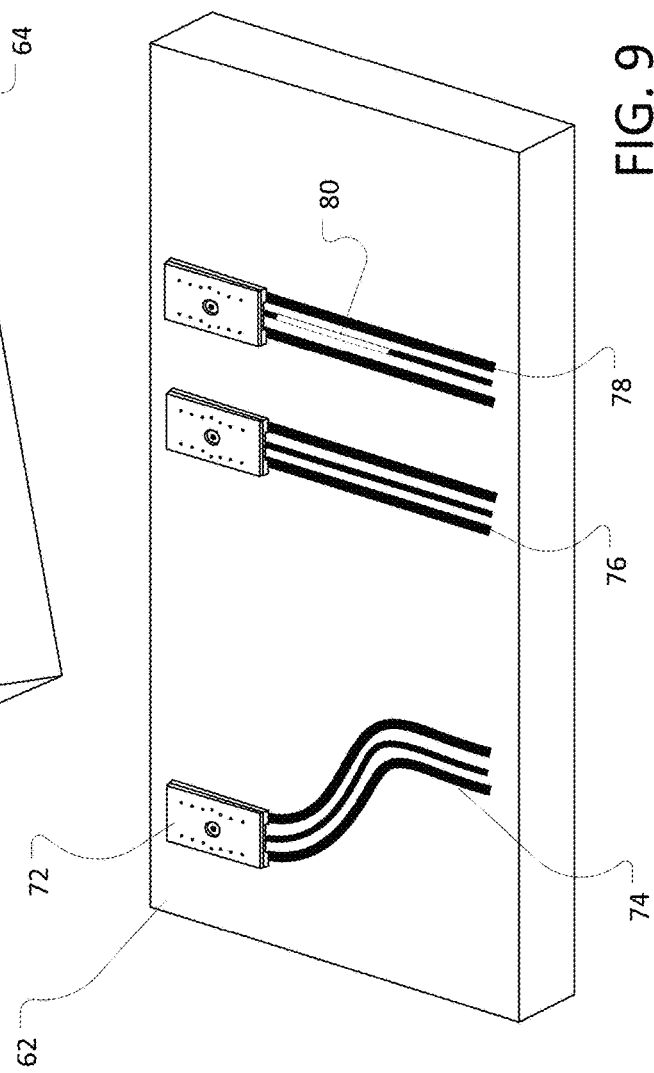
FIG. 9 shows an embodiment of a routing substrate with multiple paths.

FIG. 9 shows a closer view of the three possible paths shown in FIG. 8 with their associated contactor plates. Path 74 forms a connection between connector 66 and connector 68. This discussion refers to paths such as this one, attenuated or not as "lateral offset" paths to indicate that they form connections between connectors that are not in line with each other. Each of the paths may include precision spring plates such as 72 to provide contact to the connectors. Referring back to FIG. 4, the contact plates there reside at the ends of the substrates to allow the connectors to make contact. In the embodiments having only one moving substrate, the contact places may reside away from being directly on the edge because the connectors can translate in the x-axis (or the y-axis) and move to the contact plates in the z-axis.

The lateral offset path 74 may allow connection to a TDR (time domain reflectometer) or specific ASIC (application-specific integrated circuit) designed for a particular purpose, such as a specific voltage range. Path 76 provides a through path between connector 66 and 70, and path 78 provides an attenuated path that includes attenuator 80 between connectors 66 and 70. The attenuator path may have several functions, as mentioned above, including lowering a signal voltage to better match a larger input signal to the dynamic range of the test and measurement device input hardware. The substrate may have many different paths, including many different types of attenuation, but the movement will allow the selection of one of at least two conductive paths.

Figure 10:
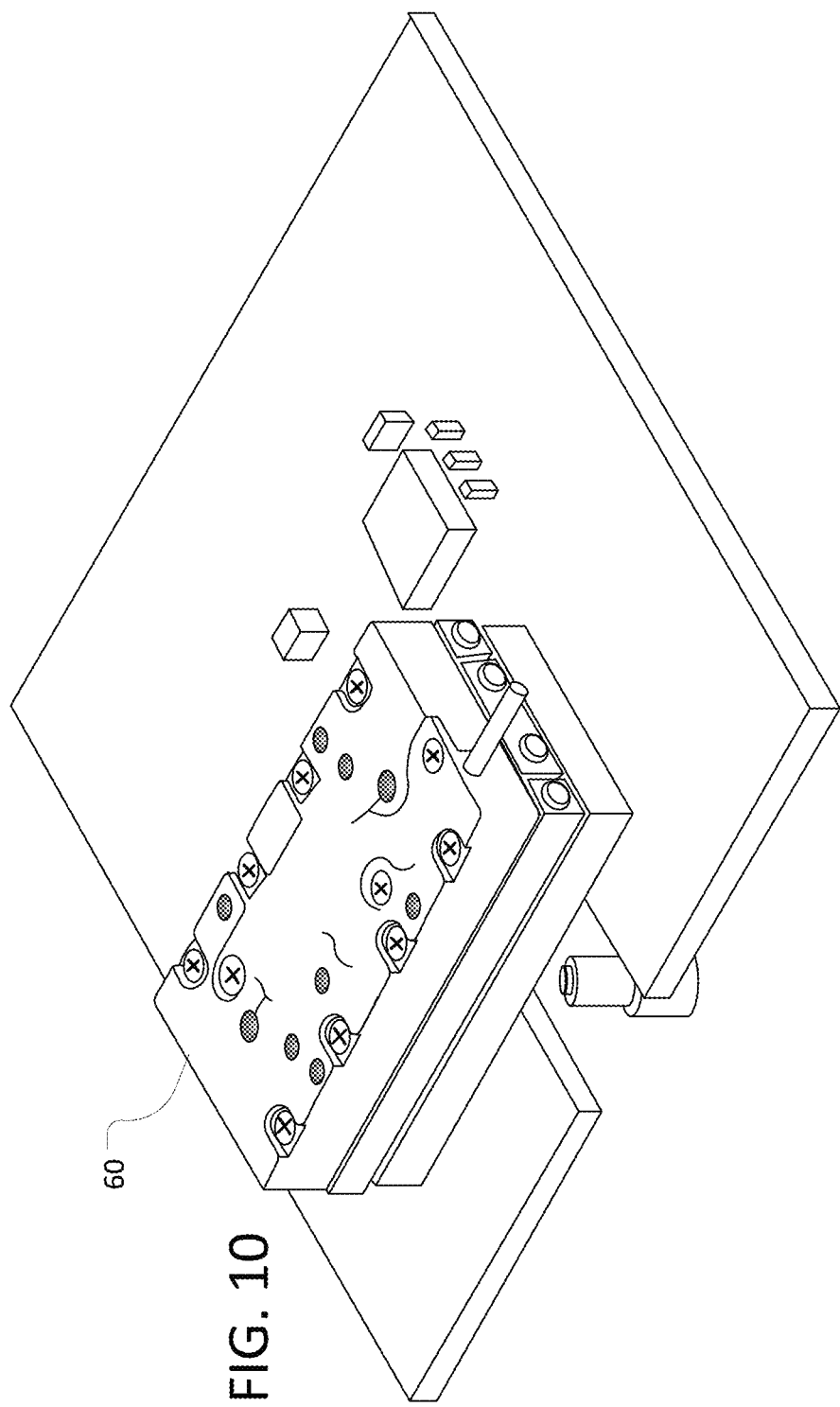
FIG. 10 shows an embodiment of a router with a printed circuit board.

FIG. 10 shows the linear stage where the routing platter has precision spring plates built on it, and then engages with a ceramic substrate that has routing out to the scope. In this view, the housing 60 is opaque, and the connectors such as 68 reside 'below' the routing apparatus.

Figure 11:
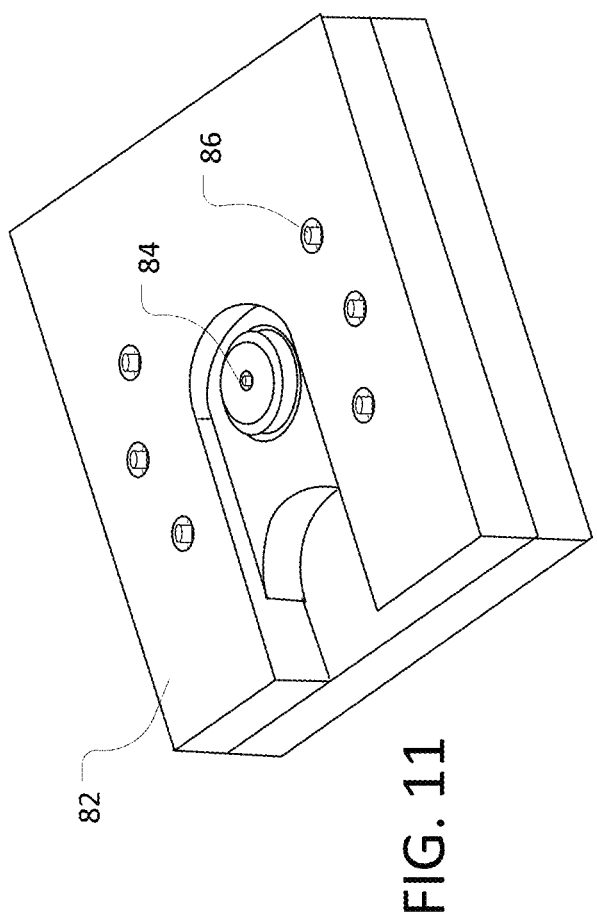
FIG. 11 shows an embodiment of a contact for a connector.
Figure 12:
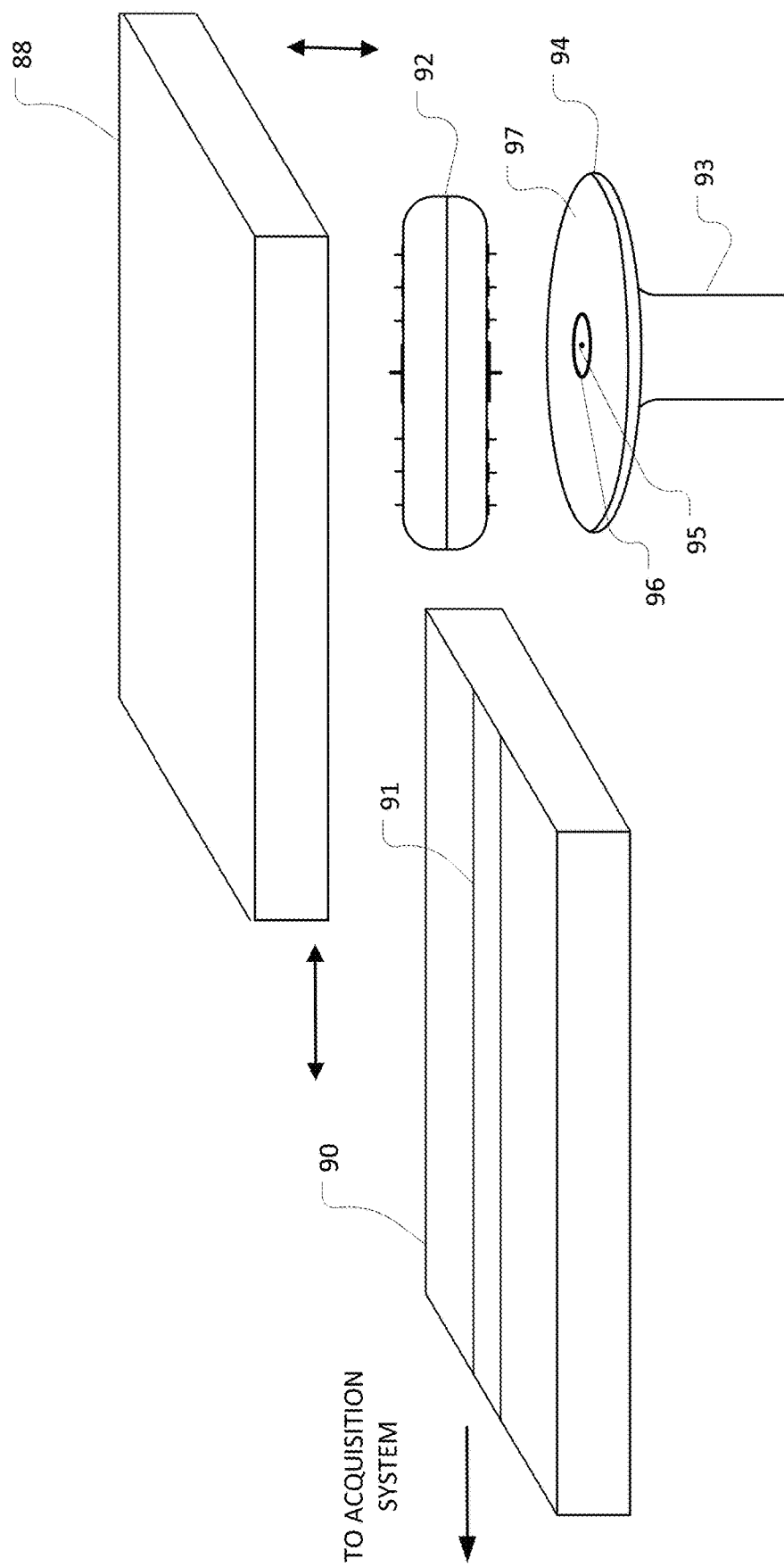
FIG. 12 shows an embodiment of a router having a fixed substrate and a moveable substrate with an interface structure.

In some embodiments, in which where only one substrate moves, the contact structure may vary from the previous embodiments. In this embodiment, the moving substrate may also be referred to as the routing substrate. FIG. 11 shows an embodiment of a different type of contact structure that may reside on the routing substrate. FIG. 11 shows a top view of a connector 82 that may lie on a fixed substrate in the router. The spring tip 84 creates the connection between the center conductor of a connector and a spring plate on the ceramic substrate. An array of ground contacts such as 86 also reside in the connector to connect to the ground braid/body/contacts of the coax portion FIG. 12 shows an embodiment of a moving substrate having a different contact structure, similar to FIG. 7. In FIG. 12, the moving substrate 88 translates along a first axis and moves up and down relative to the page. The underside of the moving substrate 88 may contain circuit components and other structures. An interface structure 92, which may be similar to the double-faced interface portion 49 of FIG. 7, makes connection to the cable 93 and the moving substrate 88. The cable 93 has a face 94 that has a center conductor 95, dielectric 96, and ground 97. There would may be multiple cables such as 93, each making a different connection away from the moving substrate. Additionally, or instead, the platter may have multiple interfaces on its underside to allow different transmission paths to connect to the fixed substrate 90.

The interface structure 92 may reside on the cable, or on the moving substrate 88. Similarly, and additional interface structure, not show for simplicity, may reside on the moving substrate 88, or on the fixed substrate 90. This embodiment allows connection between the cable 93 and the transmission path 91 on the fixed substrate 90. The transmission path may be a 50 Ω impedance transmission line to the substrate.

FIG. 13 shows an embodiment of the fixed substrate 100 of the router. The fixed substrate 100 has contact structures 102, 104 and 106. Contactor 102 may be the input connector to the test and measurement device hardware and may connect to an integrated circuit 112. Contactor 104 connects to the cable input 110. Contactor 106 connects to the cable input 108. These are just examples of possible connections and are in no way meant to limit the scope of the claims.

FIG. 14 shows the routing substrate 114 in outline. In the configuration shown, the conductive path connects the cables 110 to 108 of FIG. 13 through the contact structures 106 and 104. As can be seen in FIG. 14, the moving substrate has multiple paths.

Figure 15:
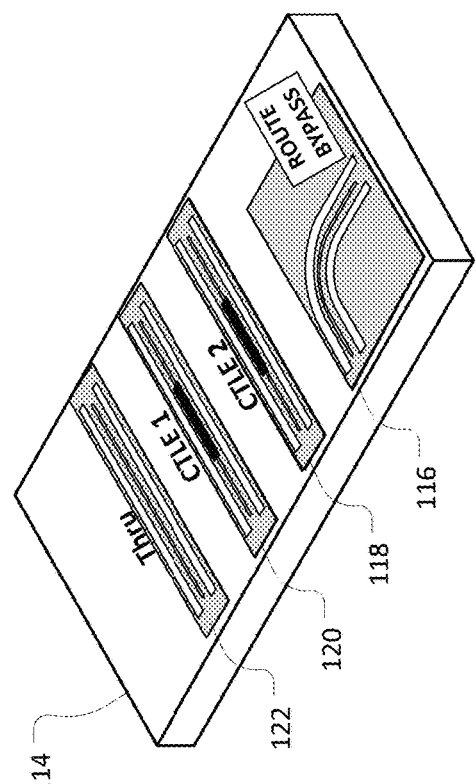
FIG. 15 shows an embodiment of a routing substrate.

FIG. 15 shows an embodiment of a routing substrate 114 having four paths. In this embodiment, the path 116 forms a route bypass that does not involve the input contact structure 102 shown in FIG. 13. Paths 118 and 120 form straight connections between the contact structures 102 and 104, and their corresponding cables. The two paths 118 and 120 are CTLE (continuous time linear equalization) paths. The CTLE paths generally comprise filters with an upward-sloped response matched to a downward-sloped lossy signal path. Path 122 forms a through path between the connectors. Other types of attenuated paths may include low pass, band pass, filters, AC coupling, RF limiters, ESD protection, TDR elements, etc.

Figure 16:
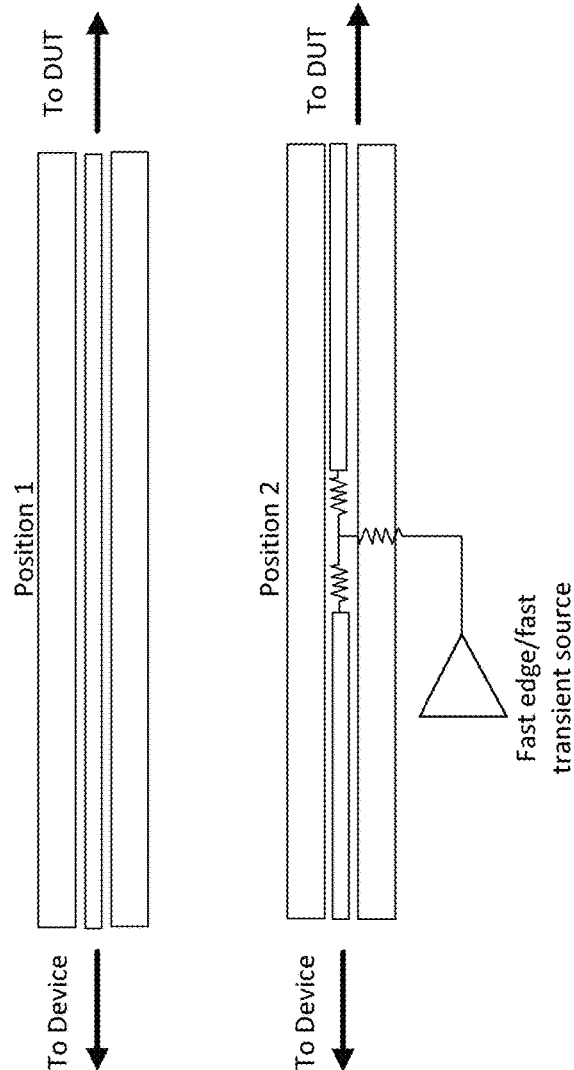
FIG. 16 shows an embodiment of conductive paths on a routing substrate.

FIG. 16 shows an embodiment of routing paths on a routing substrate that include a TDR path. In position 1, the test and measurement device operates with its standard functionality and the signal passed from the DUT to the measurement device without any parasitics. Position 2 switches a TDR signal source into the signal path. Factory calibration could compensate for losses of the incident and reflected paths due to the resistor splitter. One should note that the resistor splitter may take other forms. While a TDR comprises a conventional type of signal, any broadband signal could be used such as a chirp, impulse, AC-coupled steps, etc. The test and measurement device may convert to any of these signals shapes back into a TDR type display. The grounded co-planar waveguide structure may require the coupling circuit to be partly on the back of the board for optimal performance. Any of these non-idealities may also be calibrated.

Figure 17:
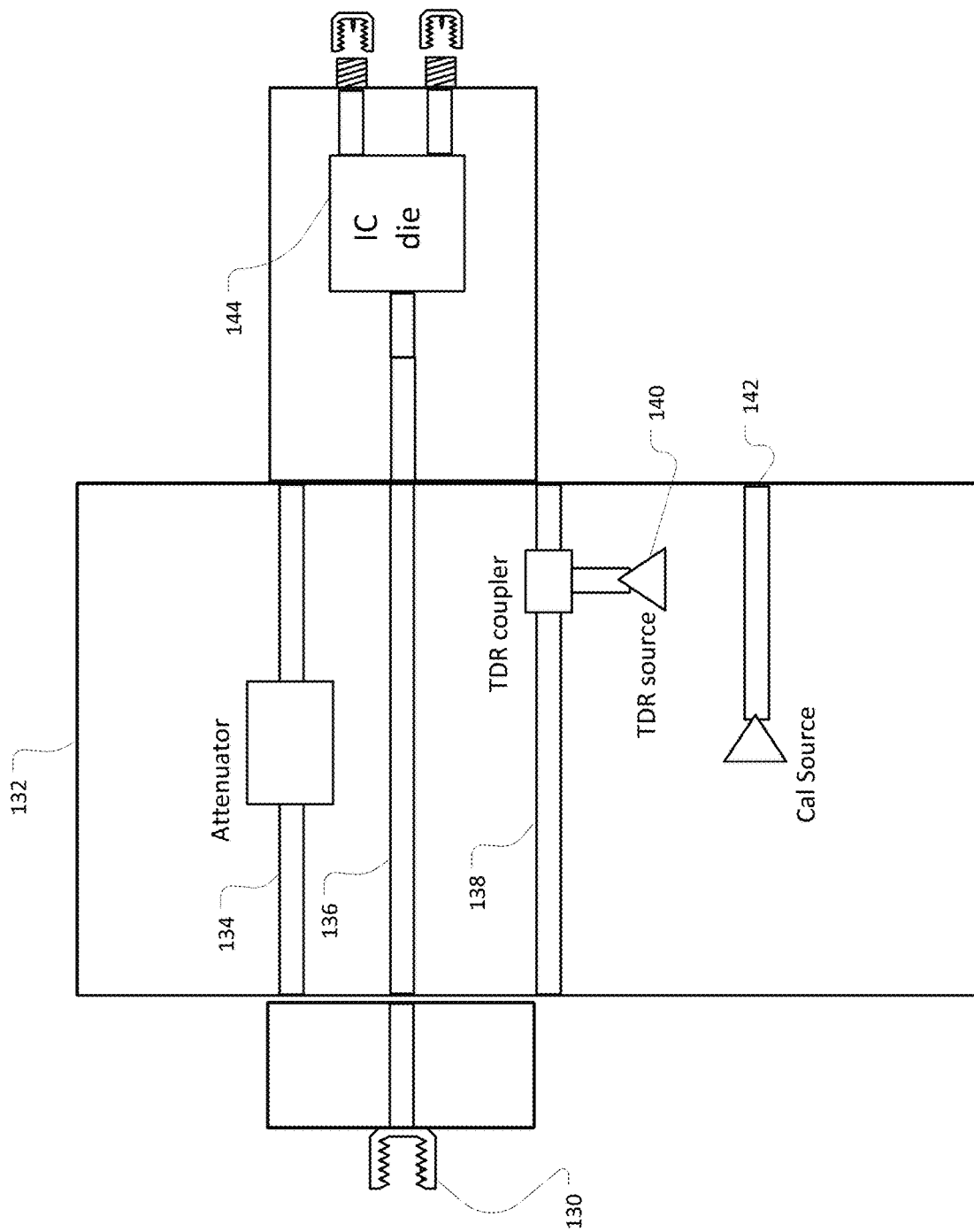
FIG. 17 shows an embodiment of conductive paths on a routing substrate.

FIG. 17 shows another embodiment of a switching router having a movable substrate 132. The input from the DUT connects through the connector 130. The path from the connector 130 then selectively connects to the input IC 144 of the test and measurement device. In this embodiment the paths may include an attenuated path 134, a through path 136, a TDR coupler 138 connected to a TDR source 140 for the signal used for TDR, and a calibration source 142. Each path forms based upon the movement of the movable substrate 132

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is an apparatus, comprising: a first substrate having first and second contacts at first and second ends of the first substrate; a second substrate having contacts at first and second ends of the second substrate; at least two connectors located in a same plane, at least one connector positioned adjacent the first ends of the first and second substrates, and at least one connector positioned adjacent the second ends of the first and second substrates; a first stage connected to the first substrate operable to move the first substrate to contact the at least two connectors to form a first electrically conductive path; and a second stage connected to the second substrate operable to move the second substrate to contact the at least two connectors to form a second electrically conductive path.

Example 2 is the apparatus of claim 1 wherein the first and second contactor plates comprise: at least two spring contacts; and at least one of the at least two spring contacts having an insulative sleeve.

Example 3 is the apparatus of any of the Examples of 1 and 2 wherein the at least two connectors comprise: a center conductor spring surrounded by an insulating dielectric; a ground contact array in the insulating dielectric; and a coaxial connector around the center conductor.

Example 4 is the apparatus of any of the Examples 1 through 3 wherein one of the first and second electrically conductive paths comprises a through path.

Example 5 is the apparatus of Example 4, wherein the through path has a lateral offset.

Example 6 is the apparatus of any of the Examples 1 through 5, wherein at least one of the first and second electrically conductive paths includes an attenuator.

Example 7 is the apparatus of Example 6, wherein the attenuator comprises a filter comprising one of a band pass, low pass, and continuous time linear equalization.

Example 8 is the apparatus of any of Examples 1 through 7, further comprising a first motor connected to the first stage, the first motor configured to cause the first stage to move, and a second motor connected to the second stage, the second motor configured to cause the second stage to move.

Example 9 is the apparatus of Example 8, further comprising an S-parameter correction system to monitor the position of at least one of the two stages and to adjust the position as needed.

Example 10 is an apparatus, comprising: a substrate having at least two electrically conductive paths; a housing containing the substrate; a plurality of coaxial connectors in the housing, each connector having a contact structure to connect to ground and a spring contact, the plurality of connectors arranged to connect to at least one of the conductive paths depending upon a position of the substrate; and a motorized stage operable to move the substrate to align one of the at least two conductive paths to form a connection between two of the connectors.

Example 11 is the apparatus of Example 10, further comprising a controller to actuate the stage to move.

Example 12 is the apparatus of any of Examples 10 and 11, wherein the at least two conductive paths comprise three conductive paths, wherein at least one of the conductive paths comprises one of a through path, an attenuated path, and a path having a lateral offset.

Example 13 is the apparatus of any of the Examples 10 through 12, wherein the at least two conductive paths comprising four conductive paths, wherein at least one of the conductive paths comprises one of a through path, a path having a lateral offset, and an attenuated path.

Examples 14 is the apparatus of any of the Examples 10 through 13, wherein at least one of the at least two electrically conductive paths comprises a continuous time linear equalization path.

Example 15 is the apparatus of any of the Examples 10 through 14, wherein at least one of the two electrically conductive paths comprises one of a band pass or low pass filter.

Example 16 is the apparatus of any of the Examples 10 through 15, wherein at least one of the two electrically conductive paths comprises a time domain reflectometer.

Example 17 is the apparatus of any of the Examples 10 through 16, wherein the contact structure comprises an array of ground pins contained in a dielectric, and a spring contact.

Example 18 is the apparatus of any of the Examples 10 through 17 wherein the motorized stage is operable to translate along at least one axis in a first plane.

Example 19 is the apparatus of Example 18, wherein the motorized stage is operable to move perpendicular to the first plane.

Example 20 is the apparatus of any of the Examples 10 through 19, further comprising an S-parameter correction system to monitor the position of the substrate and adjust the position as necessary.

Example 21 is the apparatus of any of the Examples 10 through 20, wherein at least one of the coaxial connectors includes an interface structure comprising a two-sided structure, each side having a center conductor contact, a dielectric contact and a ground contact.

Example 22 is an apparatus, comprising: at least substrate having at least two conductive paths; a least two connectors positioned in a first plane; and a movable stage connected to one of the at least one substrate to move the one substrate perpendicular to the first plane form an electrically conductive path between two of the at least two connectors.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:

1. An apparatus, comprising:
   a first substrate having a first contact at a first end of the first substrate, a second contact at a second end of the first substrate, and a first electrically conductive path on the first substrate between the first contact and the second contact;
   a second substrate having a first contact at a first end of the second substrate, a second contact at a second end of the second substrate, and a second electrically conductive path on the second substrate between the first contact and the second contact;
   at least two connectors located in a same plane, at least one connector positioned adjacent the first ends of the first and second substrates, and at least one other connector positioned adjacent the second ends of the first and second substrates; and
   a first movable stage connected to at least one of the first substrate and the second substrate, the first movable stage operable to move at least one of the first substrate or the second substrate to contact the at least two connectors to connect the at least two connectors to the first electrically conductive path or the second electrically conductive path.

2. The apparatus as claimed in claim 1, wherein the first and second contacts comprise:
   at least two spring contacts; and
   at least one of the at least two spring contacts having an insulative sleeve.

3. The apparatus as claimed in claim 1, wherein the at least two connectors comprise:
   a center conductor spring surrounded by an insulating dielectric;
   a ground contact array in the insulating dielectric; and
   a coaxial connector around the center conductor.

4. The apparatus as claimed in claim 1, wherein one of the first and second electrically conductive paths comprises a through path.

5. The apparatus as claimed in claim 4, wherein the through path has a lateral offset.

6. The apparatus as claimed in claim 1, wherein at least one of the first and second electrically conductive paths includes an attenuator.

7. The apparatus as claimed in claim 6, wherein the attenuator comprises a filter comprising one of a band pass, low pass, and continuous time linear equalization.

8. The apparatus as claimed in claim 1, further comprising a second movable stage and a first motor connected to the first stage, the first motor configured to cause the first stage to move, and a second motor connected to the second stage, the second motor configured to cause the second stage to move.

9. The apparatus as claimed in claim 8, further comprising an S-parameter correction system to monitor the position of at least one of the first and second stages and to automatically adjust a response of the apparatus by applying an S-parameter correction based on the position.

10. An apparatus, comprising:
    a substrate having at least two electrically conductive paths;
    a housing containing the substrate;
    a plurality of connectors in the housing, each connector having a contact structure to connect to ground and a spring contact, the plurality of connectors arranged to connect to at least one of the conductive paths depending upon a position of the substrate; and
    a motorized stage in the housing operable to move the substrate to align one of the at least two electrically conductive paths to form a connection between two of the connectors.

11. The apparatus as claimed in claim 10, further comprising a controller to actuate the stage to move.

12. The apparatus as claimed in claim 10, wherein the at least two conductive paths comprise three conductive paths, wherein at least one of the conductive paths comprises one of a through path, an attenuated path, and a path having a lateral offset.

13. The apparatus as claimed in claim 10, wherein the at least two conductive paths comprising four conductive paths, wherein at least one of the conductive paths comprises one of a through path, a path having a lateral offset, and an attenuated path.

14. The apparatus as claimed in claimed 10, wherein at least one of the at least two electrically conductive paths comprises a continuous time linear equalization path.

15. The apparatus as claimed in claim 10, wherein at least one of the two electrically conductive paths comprises one of a band pass or low pass filter.

16. The apparatus a claimed in claim 10, wherein at least one of the two electrically conductive paths comprises a time domain reflectometer.

17. The apparatus as claimed in claim 10, wherein the contact structure comprises an array of ground contacts and a spring contact.

18. The apparatus as claimed in claim 10, wherein the motorized stage is operable to translate along at least one axis in a first plane.

19. The apparatus as claimed in claim 18, wherein the motorized stage is operable to move perpendicular to the first plane.

20. The apparatus as claimed in claim 10, further comprising an S-parameter correction system to monitor the position of the substrate and automatically adjust a response of the apparatus by applying an S-parameter correction based on the position.

21. The apparatus as claimed in claim 10, wherein at least one of the coaxial connectors includes an interface structure comprising a two-sided structure, each side having a center conductor contact, a dielectric and a ground contact.

22. An apparatus, comprising:
   at least one substrate having at least two electrically conductive paths;
   at least two connectors positioned in a first plane; and
   a movable stage connected to one of the at least one substrate to move the one substrate perpendicular to the first plane to connect two of the at least two connectors to one of the at least two electrically conductive paths.

23. The apparatus as claimed in claim 1, the first movable stage connected to the first substrate, the apparatus further comprising a second stage connected to the second substrate operable to move the second substrate to connect the at least two connectors to the second electrically conductive path.

* * * * *